United States Patent [19]

Ikeda et al.

[11] Patent Number: 5,715,258
[45] Date of Patent: Feb. 3, 1998

[54] ERROR DETECTION CODE PROCESSING DEVICE

[75] Inventors: Shingo Ikeda, Kawasaki; Motokazu Kashida, Musashino, both of Japan

[73] Assignee: Canon Kabushiki Kaisha, Tokyo, Japan

[21] Appl. No.: 37,664

[22] Filed: Mar. 24, 1993

Related U.S. Application Data

[63] Continuation of Ser. No. 550,438, Jul. 10, 1990, abandoned.

[30] Foreign Application Priority Data

Jul. 13, 1989 [JP] Japan ................. 1-181162

[51] Int. Cl.⁶ ........................................... G06F 11/00
[52] U.S. Cl. ................................. 371/37.8; 371/37.6
[58] Field of Search ..................... 371/37.8, 37.6, 371/67.1, 68.1, 68.2, 3

[56] References Cited

U.S. PATENT DOCUMENTS

| | | | |
|---|---|---|---|
| 3,601,800 | 8/1971 | Lee | 371/37.6 |
| 4,117,458 | 9/1978 | Burghard et al. | 371/37.8 |
| 4,242,752 | 12/1980 | Herkert | 371/37.8 |
| 4,271,517 | 6/1981 | Krauss | 371/37.8 |
| 4,312,068 | 1/1982 | Goss et al. | 371/37 |
| 4,473,902 | 9/1984 | Chen | 371/37.8 |
| 4,531,213 | 7/1985 | Scheuneman | 371/3 |
| 4,623,999 | 11/1986 | Patterson | 371/37.8 |
| 4,823,347 | 4/1989 | Chin et al. | 371/49.1 |
| 4,958,349 | 9/1990 | Tanner et al. | 371/37.8 |
| 5,040,179 | 8/1991 | Chen | 371/37.8 |
| 5,200,963 | 4/1993 | Chau et al. | 371/68.1 |

*Primary Examiner*—Ly Hua
*Attorney, Agent, or Firm*—Fitzpatrick, Cella, Harper & Scinto

[57] ABSTRACT

An error detection code decoding device in which information codes obtained through a transmission path and original check codes which correspond to the information codes and which are obtained through the transmission path are input. A processor receives the input information codes and forms restored check codes by using the information codes, the processor including lookup tables for inputting the information codes as addresses and reading out data regarding the restored check codes. A detector detects whether or not the restored check codes and the original check codes coincide and outputs an error detection signal indicative of the presence or absence of an error.

6 Claims, 6 Drawing Sheets

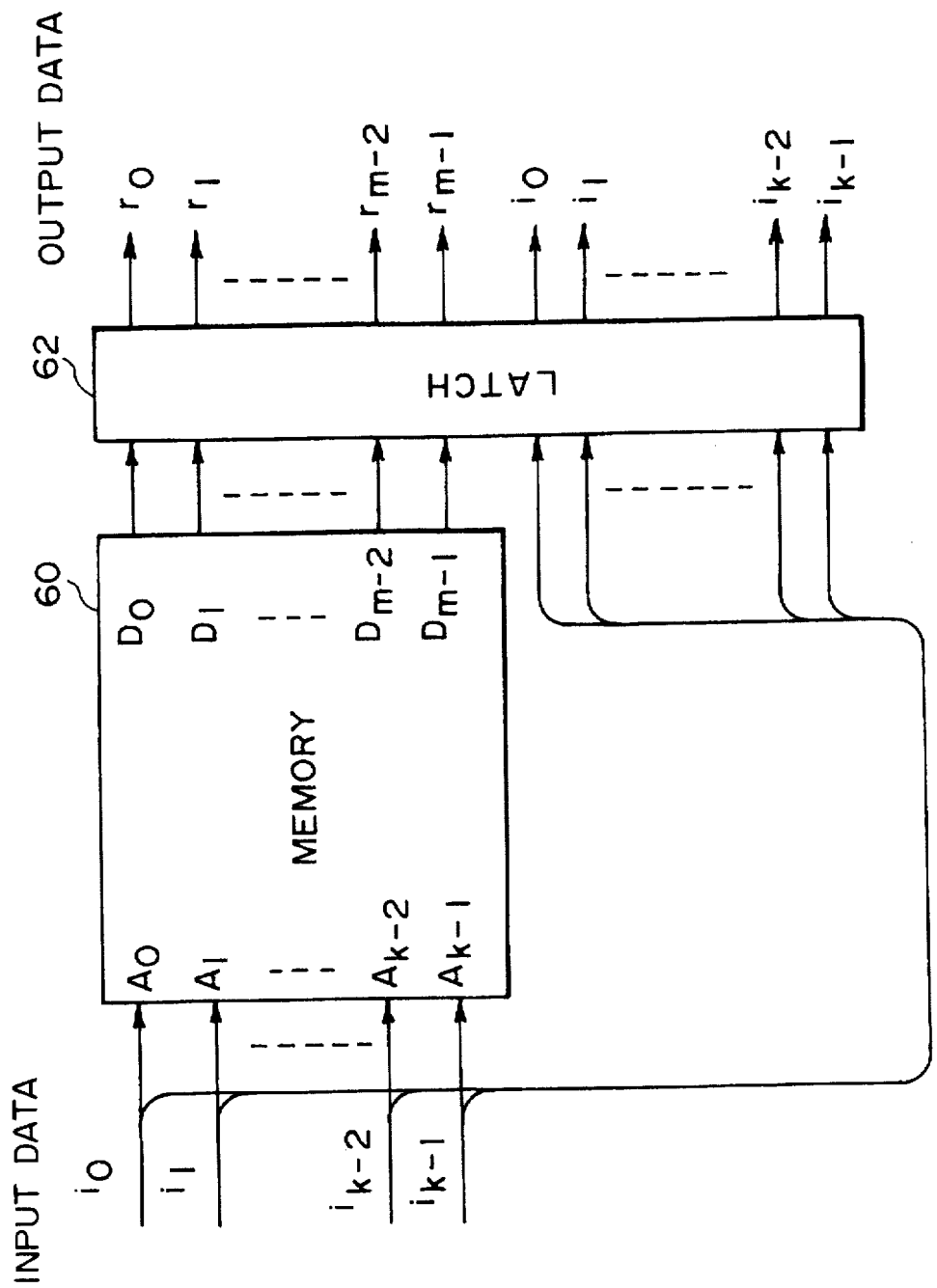
F I G. 3

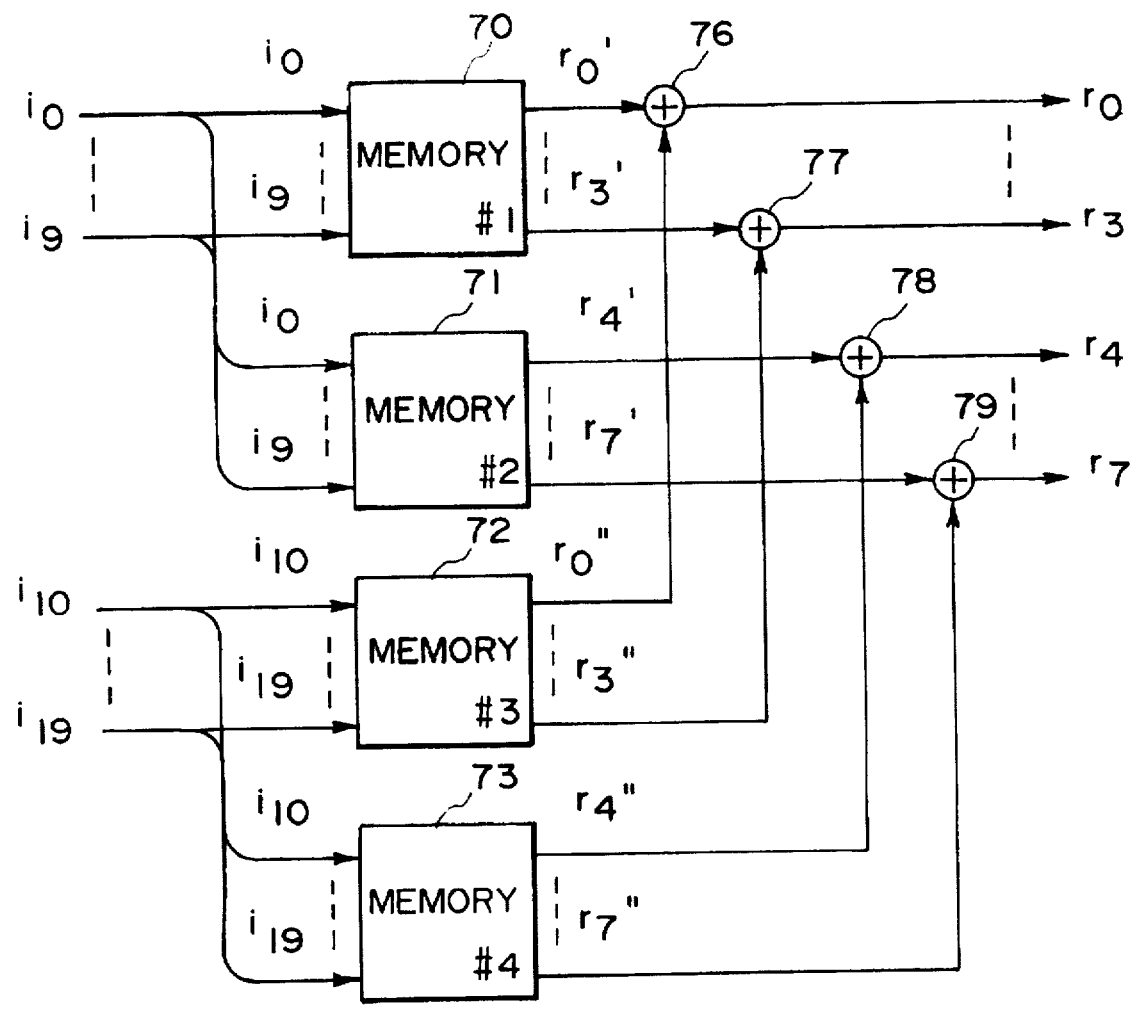
F I G. 5

ERROR DETECTION CODE PROCESSING DEVICE

This application is a continuation of application Ser. No. 07/550,438 filed Jul. 10, 1990, which is now abandoned.

BACKGROUND OF THE INVENTION

1. Field of the Invention

The present invention relates to an error detection code processing device for processing a code for detection of a data transmission error at a high speed.

2. Related Background Art

Hitherto, in a digital signal transmission system, there is used an error detection correction system for detecting and correcting a transmission error by adding proper redundancy bits to information data. As one of the encoding systems, there is a CRCC (cyclic redundancy check code) by a cyclic code. A conventional example of a coding and decoding apparatus of the CRCC will now be described hereinbelow. However, it is assumed that all of the following operations are based on the Galois field.

In the case of cyclically encoding, assuming that an information polynomial I(x) is $$I(x)=i_0+i_1x+i_2x^2+i_3x^3+ \ldots +i_{k-1}x^{k-1} \qquad (1)$$

and a generating polynomial G(x) is $$G(x)=g_0+g_1x+g_2x^2+g_3x^3+ \ldots +g_m x^m \qquad (2)$$

a code word A(x) as a system code is obtained by $$A(X)=R(x)+I(x)x^m \qquad (3)$$

where, $$R(x)=I(x)x^m \bmod G(x) \qquad (4)$$

FIG. 1 is a block diagram showing a general construction of a coding circuit to execute the above coding process. Reference numerals 10, 12, and 14 denote delay circuits of one unit time; 16, 18, and 20 indicate multipliers to multiply constants $g_0$, $g_1$, and $g_{m-1}$, respectively; 22, 24, and 26 operating circuits for getting the exclusive OR of two inputs; 28 and 30 switches; 32 a timing circuit to specify operation timings for the delay circuits 10, 12 and 14 and the switches 28 and 30; and input terminal of information to be coded; and 36 an output terminal of the code word.

The operation of FIG. 2 will be described. First, after the delay circuits (latch circuits) 10, 12, and 14 were reset, the switches 28 and 30 are connected to the a contact side and information is input from the input terminal 34 in accordance with the order of $i_{k-1}$, $i_{k-2}$, ... $i_1$, and $i_0$. Since the switch 28 is connected to the a contact, the input information of the input terminal 34 is directly output from the output terminal 36. However, the input information is also supplied to the delay circuits 10, 12, and 14 through the operating circuit 26 and multipliers 16, 18, and 20. At a time point when the input information $i_0$ is output from the output terminal 36, remainders R(x) remain in the delay circuits 10, 12, and 14. Therefore, the switches 28 and 30 are connected to the b contact side and remainders (check bits) $r_{m-1}$, $r_{m-2}$, ..., $r_1$, and $r_0$ are extracted from the output terminal 36. A code word A(x) can be obtained from the output terminal 36 in this manner.

In the case of decoding the code word A(x), assuming that a reception word Y(x) is $$Y(x)=y_0+y_1x+y_2x^2+ \ldots +y_{n-1}z^{n-1} \qquad (5)$$

and an error pattern E(x) is $$E(x)=e_0+e_1x+e_2x^2+ \ldots +e_{n-1}x^{n-1} \qquad (6)$$

the Y(x) is expressed by $$Y(x)=A(x)+E(x) \qquad (7)$$

A syndrome polynomial S(x) is expressed by $$S(x)=Y(x) \bmod G(x) \qquad (8)$$

When S(x)=0, it is determined that no error exists. That is, when no error was found out, Y(x)=A(x) and $$S(x)=\{R(x)+I(x)x^m\} \bmod G(x)=0$$

FIG. 2 is a block diagram showing a construction of a main section of a decoding circuit to execute the decoding process. Reference numerals 38, 39, 40 denote delay circuits of a unit delay amount; 42, 43, 44, 45, and 46 indicate multipliers for multiplying constants $g_0$, $g_1$, $g_2$, $g_{m-1}$, and $g_m$, respectively; 48, 49, 50, and 51 operating circuits to get the exclusive OR of two inputs; 52 a timing circuit to specify the operations of the delay circuits 38 to 40; 54 an input terminal of a code word which was transmitted through a transmission path; and 56 an output terminal of decoded information. When the reception words Y(x) are sequentially input to the input terminal 54 in accordance with the order of $Y_{n-1}$, $Y_{n-2}$, ... $Y_2$, and $Y_1$, coefficients of S(x) are obtained in the delay circuits 38 to 40. If all of the coefficients of S(x) are 0, it is determined that no error exists.

In the above conventional example, since the coding circuit and the decoding circuit operate at the same clock as a bit rate of data, they are improper for the data of a high bit rate.

SUMMARY OF THE INVENTION

Under such circumstances, it is an object of the present invention to solve the drawbacks in the conventional example as mentioned above.

Another object of the invention is to provide an error detection code processing device which can process at a high speed and is suitable to process information of a high data rate.

Under such objects, according to the invention, as one embodiment, there is provided an error detection code processing device comprising: (a) input means for inputting information codes of one code word of error detection codes; and (b) processing means for receiving the information codes from the input means and outputting check codes corresponding to the information codes of the one code word, wherein the processing means includes lookup table means for receiving at least data of a plurality of bits, as addresses, in the information codes from the input means and reading out data relating to at least a part of the check codes corresponding to the information codes of the one code word.

The above and other objects and features of the present invention will become apparent from the following detailed description and the appended claims with reference to the accompanying drawings.

BRIEF DESCRIPTION OF THE DRAWINGS

FIG. 3 is a block diagram showing a construction of a cyclic code coding circuit as an embodiment of the invention;

FIG. 5 is a block diagram showing a construction of a check bit producing circuit of a cyclic code as another embodiment of the invention.

DESCRIPTION OF THE PREFERRED EMBODIMENTS

An embodiment of the present invention will be described hereinbelow with reference to the drawings.

Figure 1:
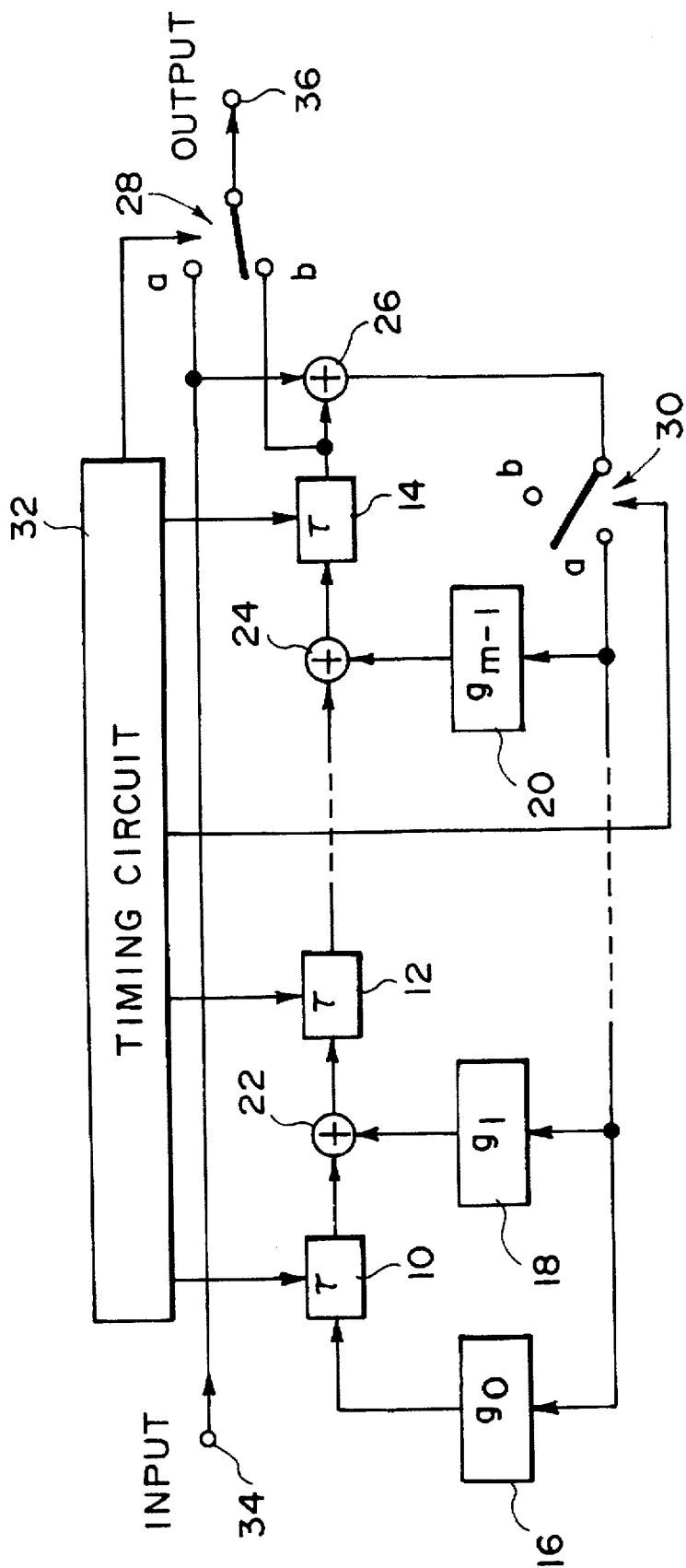
FIG. 1 is a block diagram showing a construction of a general cyclic code coding circuit.
Figure 2:
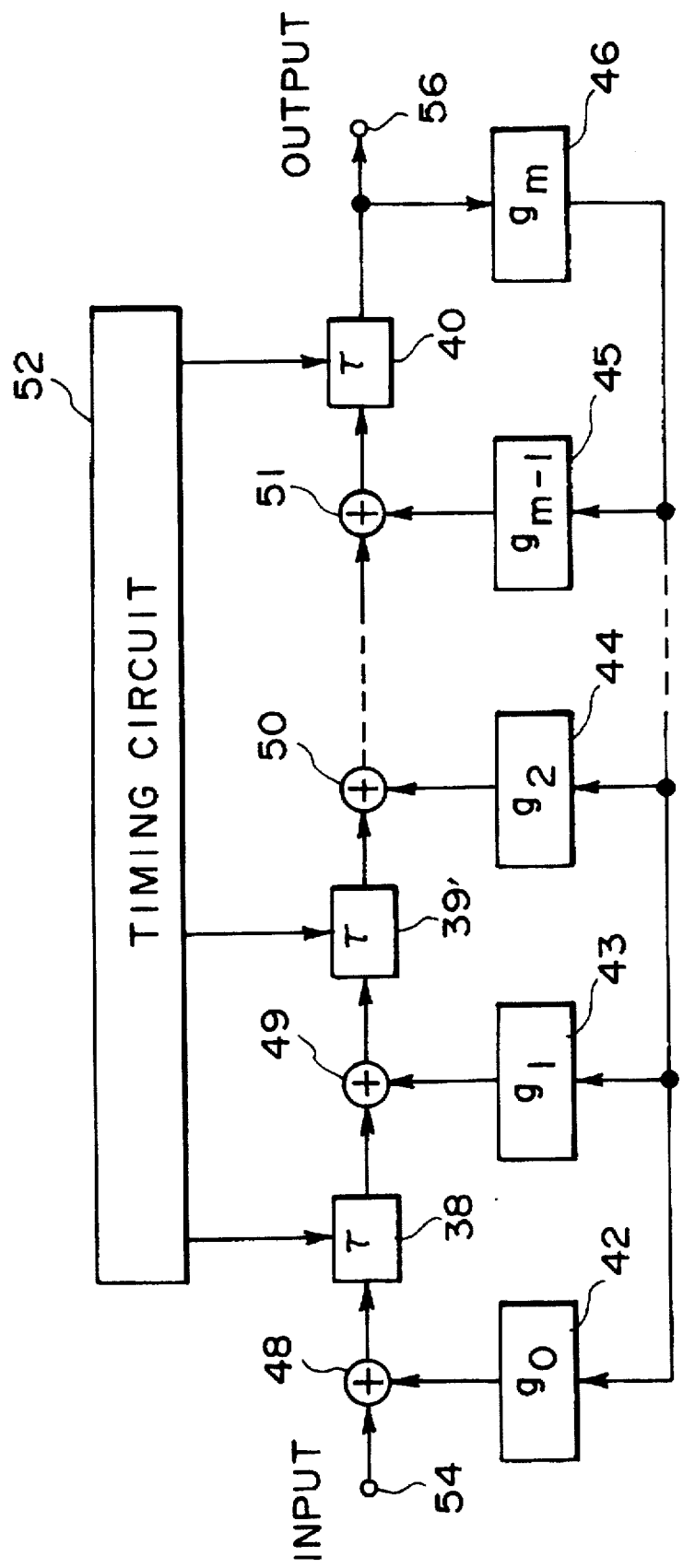
FIG. 2 is a block diagram showing a construction of a general cyclic code decoding circuit.
Figure 4:
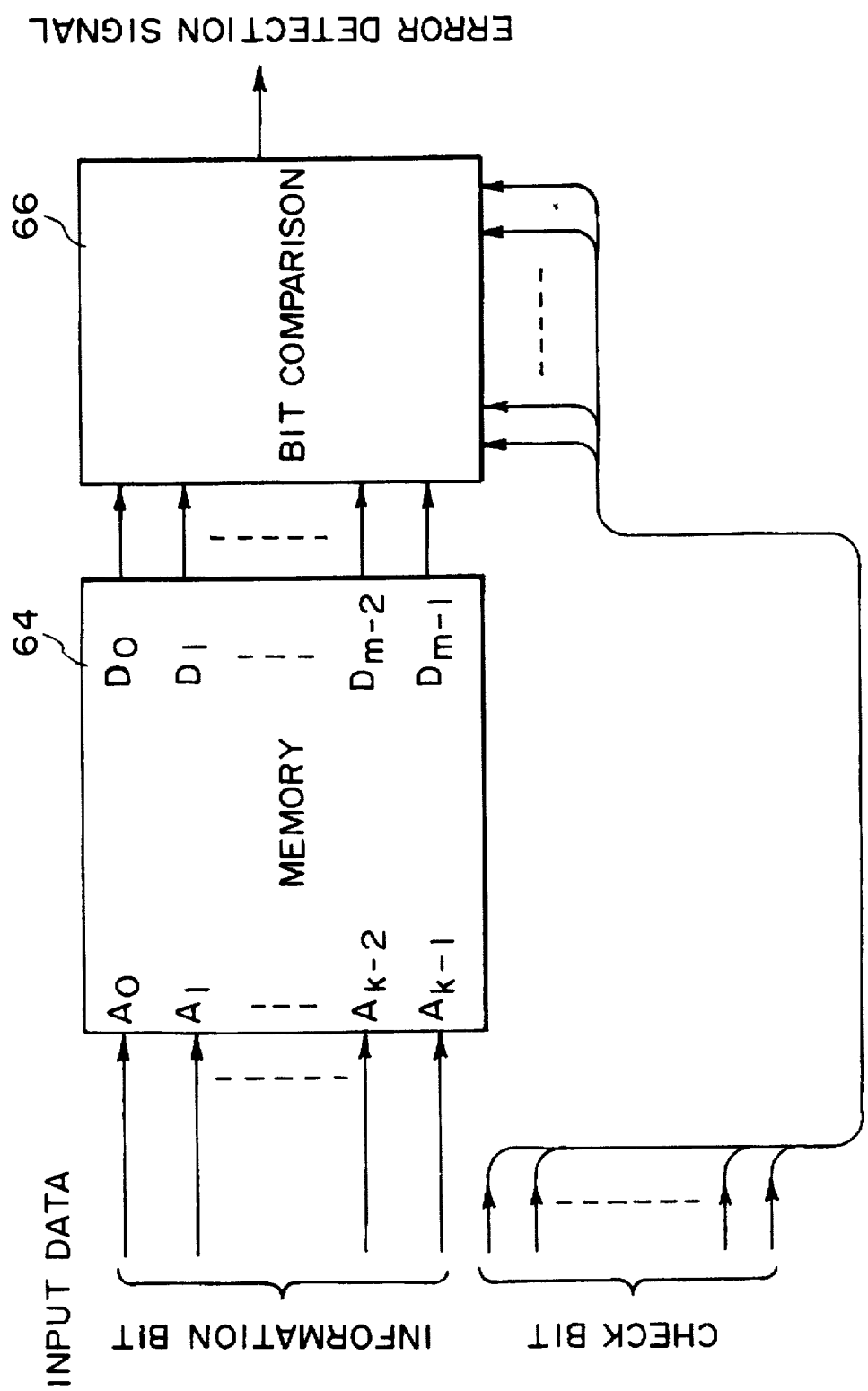
FIG. 4 is a block diagram showing a construction of a cyclic code decoding circuit as an embodiment of the invention.

FIGS. 3 and 4 are block diagrams showing constructions of an embodiment of the invention. FIG. 3 shows a coding circuit and FIG. 4 shows a decoding circuit. In FIG. 3, reference numeral 60 denotes a memory to store data, as a table, corresponding to check bits of cyclic codes for input data $i_0, i_1, \ldots, i_{k-1}$, and $i_k$. When the data $i_0, i_1, \ldots, i_{k-1}$, and $i_k$ are input to addresses $A_0, A_1, \ldots, A_{k-1}$ in the memory 60, corresponding check bits $r_0, r_1, \ldots, r_{m-1}$ are output from data outputs $D_0, D_1, \ldots,$ and $D_{m-1}$. Reference numeral 62 indicates a latch circuit for latching the input data $i_0, i_1, \ldots, i_{k-1}$, and $i_k$ and outputs of the memory 60 corresponding to them, that is, the check bits $r_0, r_1, \ldots,$ and $r_{m-1}$ and outputting as a code word.

In FIG. 4, reference numeral 64 indicates a memory of the same content as that of the memory 60. When information bits of the code word including the error pattern which was received are input to the memory 64, corresponding check bits are output therefrom. Reference numeral 66 denotes a comparator of a bit unit for comparing the check bits of the code word including the error pattern which was received and the check bits from the memory 64 on a bit unit basis and outputting an error detection signal indicative of the presence or absence of error and the error position. As the result of the bit comparison by the comparator 66, if all of the check bits coincide, respectively, it is decided that no error exists.

FIG. 5 is a block diagram showing a schematic construction of the main section of a processing circuit as the second embodiment of the invention in the case where the number of information bits constructing one code word and the number of check bits corresponding to the information bits are large. That is, FIG. 5 shows modification examples of the portions of the memories 60 and 64 in the coding circuit of FIG. 3 and the decoding circuit of FIG. 4. Reference numerals 70, 71, 72, and 73 denote memories for outputting the data regarding check bits, which will be explained hereinlater, for the address inputs. Reference numerals 76, 77, 78, and 79 indicate operating circuits for getting the exclusive OR. In the example shown in the diagram, the check bits $r_0, r_1, \ldots,$ and $r_7$ of eight bits are generated for the inputs $i_0, i_1, \ldots,$ and $i_{19}$ of 20 bits. The arithmetic operations are based on the Galois field and its theoretical background will now be described hereinbelow.

There is the relation of the following equation between the input data i and the check bits r.

$$(r_0, r_1, \ldots, r_7) = (i_0, i_1, \ldots, i_{19}) \times \begin{bmatrix} g_{1.1}, & g_{1.2}, & \ldots, & g_{1.8} \\ g_{2.1}, & \ldots & \ldots, & g_{2.8} \\ \cdot & & & \cdot \\ \cdot & & & \cdot \\ \cdot & & & \cdot \\ g_{20.1}, & g_{20.1}, & \ldots, & g_{20.8} \end{bmatrix} \quad (9)$$

The equation (9) is separated into four parts.

$$(r_0', r_1', r_2', r_3') = (i_0, i_1, \ldots, i_9) \times \begin{bmatrix} g_{1.1}, & g_{1.2}, & g_{1.3}, & g_{1.4} \\ g_{2.1}, & g_{2.2}, & g_{2.3}, & g_{2.4} \\ \cdot & \cdot & \cdot & \cdot \\ \cdot & \cdot & \cdot & \cdot \\ \cdot & \cdot & \cdot & \cdot \\ g_{10.1}, & g_{10.1}, & g_{10.3}, & g_{10.4} \end{bmatrix} \quad (10)$$

$$(r_4', r_5', r_6', r_7') = (i_0, i_1, \ldots, i_9) \times \begin{bmatrix} g_{1.5}, & g_{1.6}, & g_{1.7}, & g_{1.8} \\ g_{2.5}, & g_{2.6}, & g_{2.7}, & g_{2.8} \\ \cdot & \cdot & \cdot & \cdot \\ \cdot & \cdot & \cdot & \cdot \\ \cdot & \cdot & \cdot & \cdot \\ g_{10.5}, & g_{10.6}, & g_{10.7}, & g_{10.8} \end{bmatrix} \quad (11)$$

$$(r_0'', r_1'', r_2'', r_3'') = (i_{10}, i_{11}, \ldots, i_{19}) \times \begin{bmatrix} g_{11.1}, & g_{11.2}, & g_{11.3}, & g_{11.4} \\ g_{12.1}, & g_{12.2}, & g_{12.3}, & g_{12.4} \\ \cdot & \cdot & \cdot & \cdot \\ \cdot & \cdot & \cdot & \cdot \\ \cdot & \cdot & \cdot & \cdot \\ g_{20.1}, & g_{20.1}, & g_{20.3}, & g_{20.4} \end{bmatrix} \quad (12)$$

$$(r_4'', r_5'', r_6'', r_7'') = (i_{10}, i_{11}, \ldots, i_{19}) \times \begin{bmatrix} g_{11.5}, & g_{11.6}, & g_{11.7}, & g_{11.8} \\ g_{12.5}, & g_{12.6}, & g_{12.7}, & g_{12.8} \\ \cdot & \cdot & \cdot & \cdot \\ \cdot & \cdot & \cdot & \cdot \\ \cdot & \cdot & \cdot & \cdot \\ g_{20.5}, & g_{20.6}, & g_{20.7}, & g_{20.8} \end{bmatrix} \quad (13)$$

where, $$r_m = r_m' + r_m'' \quad (m = 0-7) \quad (14)$$

Since coefficients $\{g_{i,j}\}$ of the equation (10) are previously known, the relation of $(r_0', r_1', r_2', r_3')$ for $(i_0, i_1, \ldots, i_9)$ is previously obtained. A data table such that when $(i_0, i_1, \ldots, i_9)$ are input to the addresses, the output data of $(r_0', r_1', r_2', r_3')$ in the equation (10) can be obtained is stored into the memory 70. Similarly, data tables such as to provide the relations of the equations (11), (12), and (13) are respectively stored into the memories 71, 72, and 73.

The operations of the equation (14) are executed by the operating circuits 76, 77, 78, and 79, thereby obtaining the check bits $(r_0, r_1, \ldots, r_7)$ as final objective values.

Figure 6:
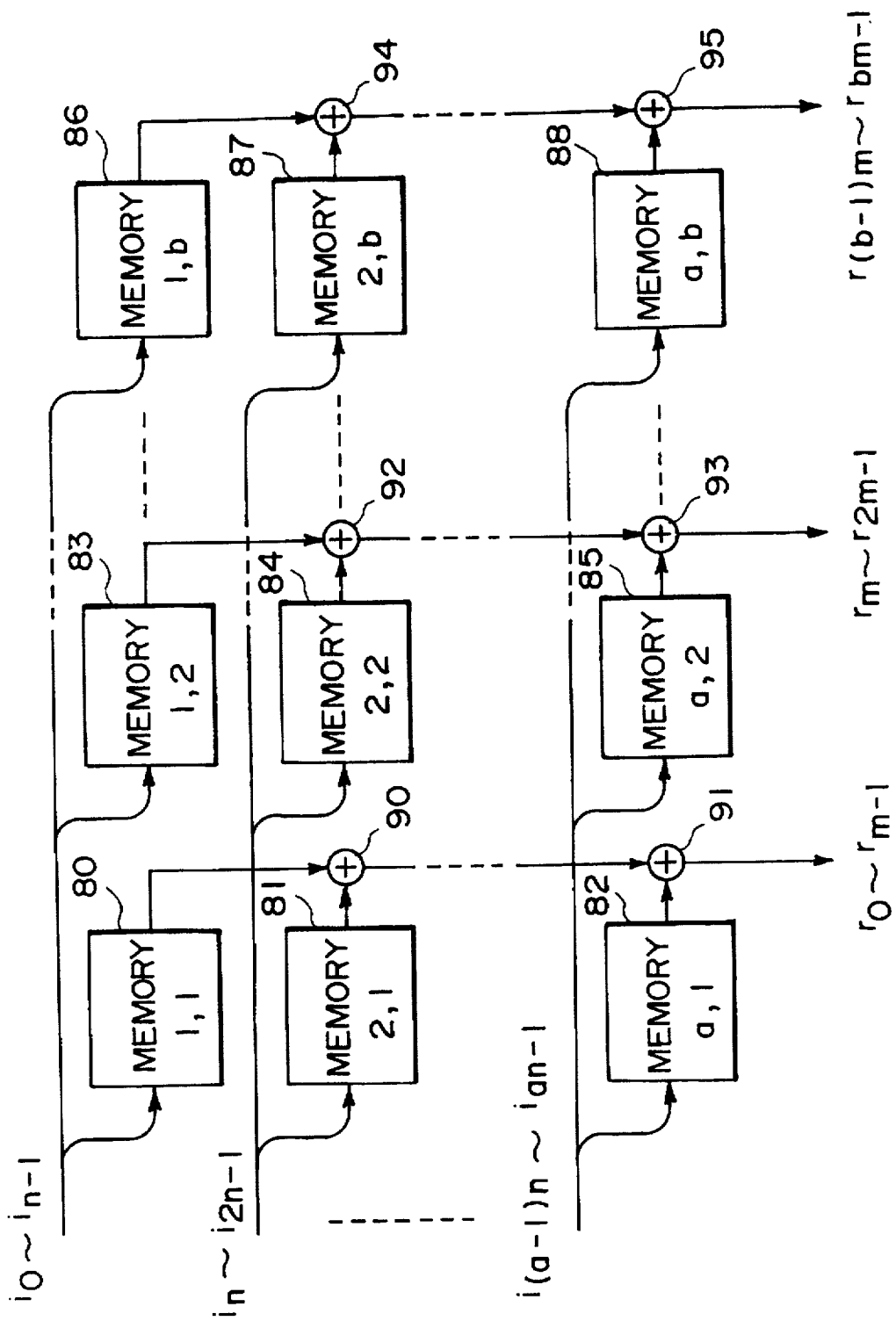
FIG. 6 is a block diagram showing a construction of a check bit producing circuit of a cyclic code as a further embodiment of the invention.

FIG. 6 is a block diagram showing a schematic construction of the main section in the embodiment in the cases where the number of information bits and the number of check bits are further increased than those in the case of FIG. 5 and where the number of information bits is set to a×n and the number of check bits is set to b×m. In a manner similar to FIG. 5, FIG. 6 shows modification examples of the portions of the memories 60 and 64 in FIGS. 3 and 4. As shown in the diagram, in the construction of FIG. 6, (a×b) memories 80 to 88 similar to the memories 70 to 73 in FIG. 5 are arranged like a matrix, the input information bits $i_0, \ldots, i_{an-1}$ are divided into groups and the information bits of each group are input to address inputs of the memory of the same row. Similar to FIG. 5, the memories 80 to 88 output the data regarding the corresponding check bits. If outputs from the memories of the same column are calculated by exclusive OR circuits 90 to 95, the objective check bits $r_0, \ldots, r_{bm-1}$ can be obtained.

In a manner similar to the case of FIG. 4, according to the decoding circuit using the circuits shown in FIGS. 5 and 6, in the constructions shown in FIGS. 5 and 6, the check bits for the information bits in the reception code word are obtained and compared with the check bits in the reception code word by a bit comparator on a bit unit basis.

With the above construction, since the data is processed in parallel, objective outputs can be obtained at a very high speed. On the other hand, since the apparatus does not depend on the bit rate, even a signal of a high bit rate can be also similarly processed at a high speed.

As will be easily understood from the above description, according to the invention, the check bits for the information bits can be obtained at a high speed irrespective of the bit rate. Thus, the data transmission of a high bit rate can be easily realized.

We claim:

1. An error detection code decoding device, comprising:
    input means for inputting, in parallel, information bits and check bits corresponding to the information bits, both of which are provided through a transmission path;
    processing means including lookup table means which stores data used to generate the check bits input by said input means, for receiving the information bits from said input means and for forming check bits by supplying the received information bits to the lookup table means to output the formed check bits, the received information bits being used as addresses of the lookup table means; and
    detecting means, arranged to receive, in parallel, the check bits formed by said processing means and the check bits input by said input means, for detecting whether or not all of the check bits formed by said processing means are identical to the check bits input by said input means and for outputting a signal-error detection signal indicative of the presence or absence of an error in the information bits input by said input means, on the basis of the detection.

2. A device according to claim 1, wherein the information bits comprise (a×n) information bits and the input check bits corresponding to the information bits comprise (b×m) check bits, and wherein the lookup table means includes (a×b) lookup table circuits for respectively receiving n information bits in parallel and respectively outputting data regarding m check bits in the formed check bits, wherein a and b are integers equal to or greater than 1, (a×b)>2 and n and m are integers equal to or greater than 2, respectively.

3. A device according to claim 2, wherein a is an integer equal to or greater than 2, and among said (a×b) lookup table circuits, a number of lookup table circuits which receive different sets of n information bits output data regarding the same m check bits in the formed check bits.

4. A device according to claim 3, wherein said processing means includes operating means for calculating an exclusive OR of data which is output from said (a×b) lookup table circuits and outputting m check bits in the formed check bits.

5. An error detection code encoding and decoding system, comprising:
    input means for inputting information bits;
    first processing means including first lookup table means which stores data used to generate check bits corresponding to the information bits input by said input means, for receiving the information bits from said input means in parallel and for forming first check bits by supplying the received information bits to the first lookup table means, the received information codes being used as addresses of the first lookup table means;
    output means for outputting the information bits and the first check bits to a transmission path;
    receiving means for receiving the information bits and the first check bits through the transmission path in parallel; and
    second processing means including second lookup table means which stores the data used to generate the first check bits received by said receiving means, for receiving the information bits from said receiving means in parallel and for forming second check bits by supplying the received information bits to the second lookup table means to output the second check bits in parallel, the received information bits being used as an address of the second lookup table means, and wherein the first check bits received by said receiving means and the second check bits formed by said second processing means are output in parallel.

6. A system according to claim 5, further comprising detecting means for receiving the second check bits formed by said second processing means and the first check bits received by said receiving means in parallel, and for detecting whether or not the first check bits and the second check bits are identical with each other and for outputting a single error detection signal indicative of a presence or absence of an error in the information bits received by said receiving means, on the basis of the detection.

* * * * *